United States Patent
Cox et al.

(10) Patent No.: US 11,598,810 B2
(45) Date of Patent: Mar. 7, 2023

(54) BATTERY RUNTIME FORECASTING FOR AN INFORMATION HANDLING SYSTEM

(71) Applicant: Dell Products L.P., Round Rock, TX (US)

(72) Inventors: Tyler Ryan Cox, Austin, TX (US); Richard Christopher Thompson, Cedar Park, TX (US); Thanh Thien Tran, Houston, TX (US)

(73) Assignee: Dell Products L.P., Round Rock, TX (US)

( * ) Notice: Subject to any disclaimer, the term of this patent is extended or adjusted under 35 U.S.C. 154(b) by 369 days.

(21) Appl. No.: 17/031,123

(22) Filed: Sep. 24, 2020

(65) Prior Publication Data

US 2022/0091190 A1 Mar. 24, 2022

(51) Int. Cl.
*G01R 31/36* (2020.01)
*G01R 31/367* (2019.01)

(52) U.S. Cl.
CPC ....... *G01R 31/3646* (2019.01); *G01R 31/367* (2019.01)

(58) Field of Classification Search
CPC .......................... G01R 31/3646; G01R 31/367
See application file for complete search history.

(56) References Cited

U.S. PATENT DOCUMENTS

| | | | | |
|---|---|---|---|---|
| 5,565,759 A * | 10/1996 | Dunstan | ................. | H02J 7/005 320/152 |
| 2012/0098500 A1* | 4/2012 | Vestama | ............... | H02J 7/0048 320/149 |
| 2012/0130661 A1* | 5/2012 | Hagimori | .......... | G01R 31/3842 702/63 |
| 2014/0125348 A1* | 5/2014 | Ben-Aicha | .......... | G01R 31/374 324/426 |
| 2020/0309857 A1* | 10/2020 | Zeyghami | ............. | H02J 7/0068 |

FOREIGN PATENT DOCUMENTS

| | | | | |
|---|---|---|---|---|
| DE | 102018005797 A1 | * | 3/2019 | |
| JP | 07274408 A | * | 10/1995 | |
| KR | 20200025495 A | * | 9/2020 | |
| WO | WO-2010094875 A1 | * | 8/2010 | .......... B60L 11/1816 |

OTHER PUBLICATIONS

Machine translation of DE-102018005797-A1, downloaded Nov. 2022 (Year: 2022).*
Machine translation of KR 20200025495-A, downloaded Nov. 2022 (Year: 2022).*
Machine translation of JP-07274408-A, downloaded Nov. 2022 (Year: 2022).*

* cited by examiner

*Primary Examiner* — John C Kuan
(74) *Attorney, Agent, or Firm* — McDermott Will & Emery LLP

(57) ABSTRACT

System and method for battery runtime forecasting, including identifying a power usage of a IHS; identifying a charge profile of a battery of the IHS, the charge profile including charging levels each associated with a respective time period; determining a state of charge of the battery based on a current time; identifying power delivery capabilities of a power source providing power to the battery; generating a predicted relative state of charge (RSOC) profile of the battery based on i) the power usage of the IHS, ii) an entirety of the charge profile of the battery, iii) the state of charge of the battery, and iv) power delivery capabilities of the power source; and identifying a runtime estimate of the battery.

20 Claims, 5 Drawing Sheets

BATTERY RUNTIME FORECASTING FOR AN INFORMATION HANDLING SYSTEM

BACKGROUND

Field of the Disclosure

The disclosure relates generally to an information handling system, and in particular, battery runtime forecasting of a battery for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Predicating battery runtime for a battery of an information handling system can be inaccurate. Often, the battery runtime is calculated based on a linear predication of the present discharge rate reported by the battery, leading to inaccurate and varying runtime predictions. For example, at a first time, the runtime predication can be 30 minutes, while just 30 seconds later, the runtime prediction could be 3 hours, causing confusion to the user.

Current information handling systems approximate a time to full of the battery based on an estimation of a current relative state of charge, a current full charge capacity of the battery, and an averaging function applied to the current rate of charge of the battery. However, this approximation of the time to full of the battery can lead to inaccurate battery runtime predictions.

SUMMARY

Innovative aspects of the subject matter described in this specification may be embodied in a method for battery runtime forecasting, including identifying a power usage of an information handling system (IHS); identifying a charge profile of a battery of the IHS, the charge profile including one or more charging levels each associated with a respective time period; determining a state of charge of the battery based on a current time; identifying power delivery capabilities of a power source providing power to the battery; generating a predicted relative state of charge (RSOC) profile of the battery based on i) the power usage of the IHS, ii) an entirety of the charge profile of the battery, iii) the state of charge of the battery, and iv) power delivery capabilities of the power source; and identifying a runtime estimate of the battery, including: i) determining, for each time period, a time to full for the time period based on the predicted RSOC profile of the battery for the time period and the charging level of the time period, and ii) calculating a summation of the time to full for each time period based on the current time to generate the runtime estimate of the battery.

Other embodiments of these aspects include corresponding systems, apparatus, and computer programs, configured to perform the actions of the methods, encoded on computer storage devices.

These and other embodiments may each optionally include one or more of the following features. For instance, identifying a charging mode of the battery; and identifying the charge profile of the battery based on the charging mode of the battery. Generating the predicted RSOC profile of the battery based on i) the power usage of the IHS, ii) the charge profile of the battery, iii) the state of charge of the battery, iv) the power delivery capabilities of the power source, and v) the charge mode of the battery. Displaying, on a graphics user interface (GUI) of the IHS, a notification indicating the runtime estimate of the battery. Identifying the runtime estimate of the battery further includes identifying a particular state of charge of the battery; determining, based on the predicted RSOC profile, a particular time associated with the particular state of charge; and determining the runtime estimate of the battery based on the particular time and the current time. The particular state of charge is 100% charge of the battery. The particular state of charge is less than 100% charge of the battery.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
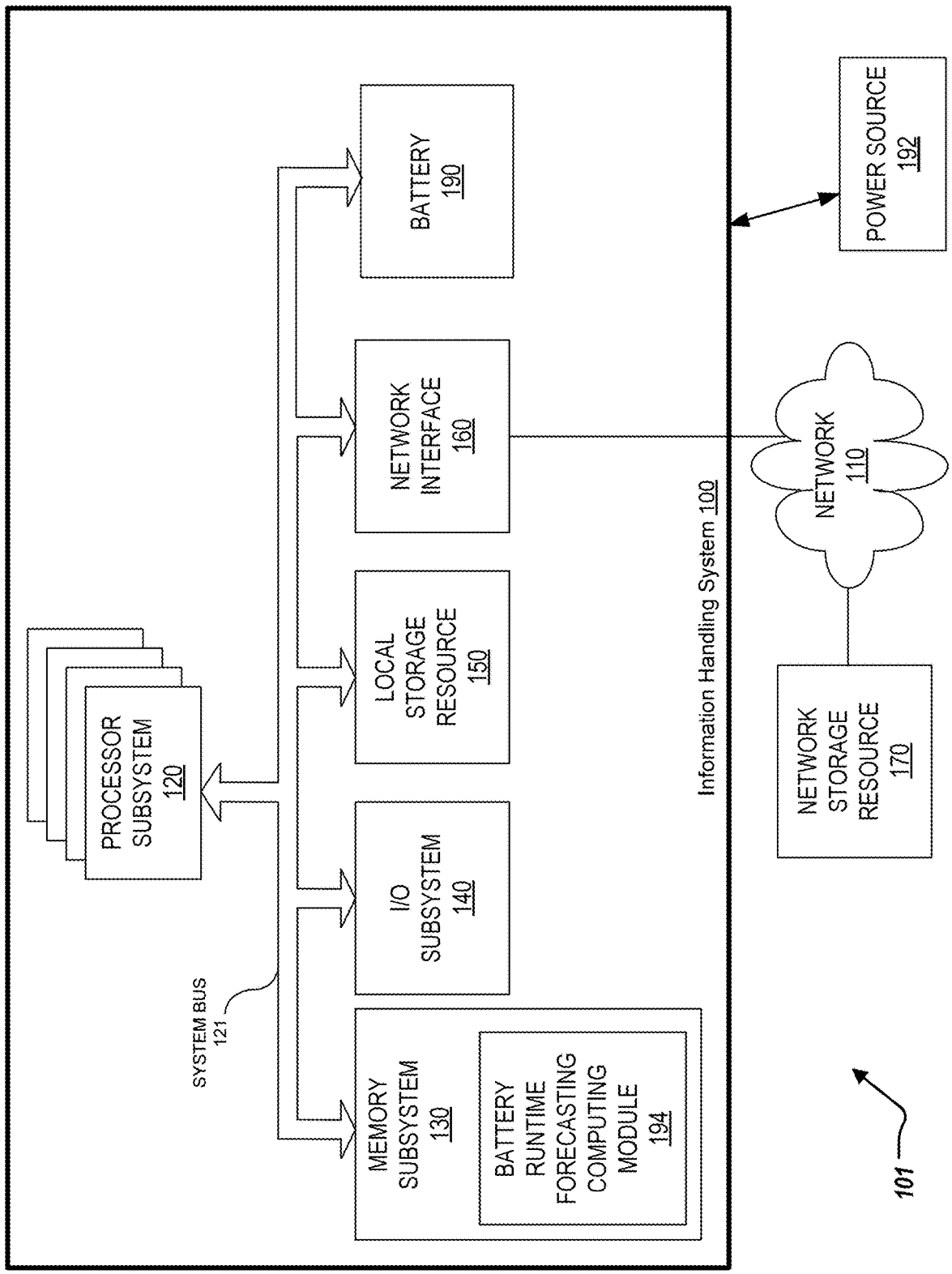
FIG. 1 is a block diagram of selected elements of an embodiment of an information handling system.

This disclosure discusses battery runtime forecasting of a battery of an information handling system based at least on an entirety of a charge profile of the battery (e.g., from 0% state of charge to 100% state of charge). In short, a runtime forecasting computing module can determine (e.g., forecast) a predicted runtime of the battery at a given time (e.g., percentage of remaining charge of the battery and/or amount of time of use for the remaining charged portion of the battery). The runtime forecasting computing module can generate a predicated relative state of charge (RSOC) of the battery based on i) a power usage of the information handling system, ii) a charge profile of the battery, iii) a state of charge of the battery, and iv) power delivery capabilities of a power source (e.g., a charging adapter). For example, the battery runtime forecasting computing module can generate, for each state of charge of the battery (e.g., from 0% state of charge to 100% state of charge), a predicated RSOC based on the power usage of the information handling system as well as the charge profile for the entirety of the charge profile of the battery (from 0% state of charge to 100% state of charge). That is, the battery runtime forecasting computing module can generate the RSOC profile for the battery that is consistent with the entirety of the charge profile, as opposed to generating the RSOC profile based on instantaneous charge rates of the battery.

Specifically, this disclosure discusses a system and a method for battery runtime forecasting, including identifying a power usage of an information handling system (IHS); identifying a charge profile of a battery of the IHS; determining a state of charge of the battery based on a current time; identifying power delivery capabilities of a power source providing power to the battery; generating a predicted relative state of charge (RSOC) profile of the battery based on i) the power usage of the IHS, ii) the charge profile of the battery, iii) the state of charge of the battery, and iv) power delivery capabilities of the power source; and identifying a runtime estimate of the battery based on the i) the predicted RSOC profile of the battery and ii) the current time.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Turning now to the drawings, FIG. 1 illustrates a block diagram depicting selected elements of a computing environment 101 that includes an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can further include a battery 190. The battery 190 can be in communication with the system bus 121 to provide power to the components (e.g., the processor subsystem 120) when the information handling system 100 is not connected to (independent of) an external power source.

The computing environment 101 can further include a power source 192 that is external to the information handling system 100. The power source 192 can supply power to the information handling system 100. Specifically, the power source 192 can supply power to the information handling system 100 for the operation of the information handling system 100 (e.g., by the processor subsystem 120). Additionally, the power source 192 can provide power to the battery 190 for charging of the battery 190 (providing energy to the battery 190). In some cases, the power source 192 can concurrently provide power to the information handling system 100 for i) the operation of the information handling system 100 and ii) charging of the battery 190.

The information handling system 100 can further include a runtime forecasting computing module 194. The runtime forecasting computing module 194 can be included by the memory subsystem 130. In short, the runtime forecasting computing module 194 can determine (e.g., forecast) a predicted runtime of the battery 190 at a given time (e.g., percentage of remaining charge of the battery 190 and/or amount of time of use for the remaining charged portion of the battery 190), as discussed further herein. The runtime forecasting computing module 194 can generate a predicated relative state of charge (RSOC) of the battery 190 based on i) a power usage of the information handling system 100 (e.g., by the processor subsystem 120), ii) a charge profile of the battery 190, and iii) a state of charge of the battery 190, discussed further herein. The RSOC of the battery 190 can be defined as the percentage of usable energy the battery 190 has stored relative to a full charge capacity (FCC) of the battery 190.

Figure 2:
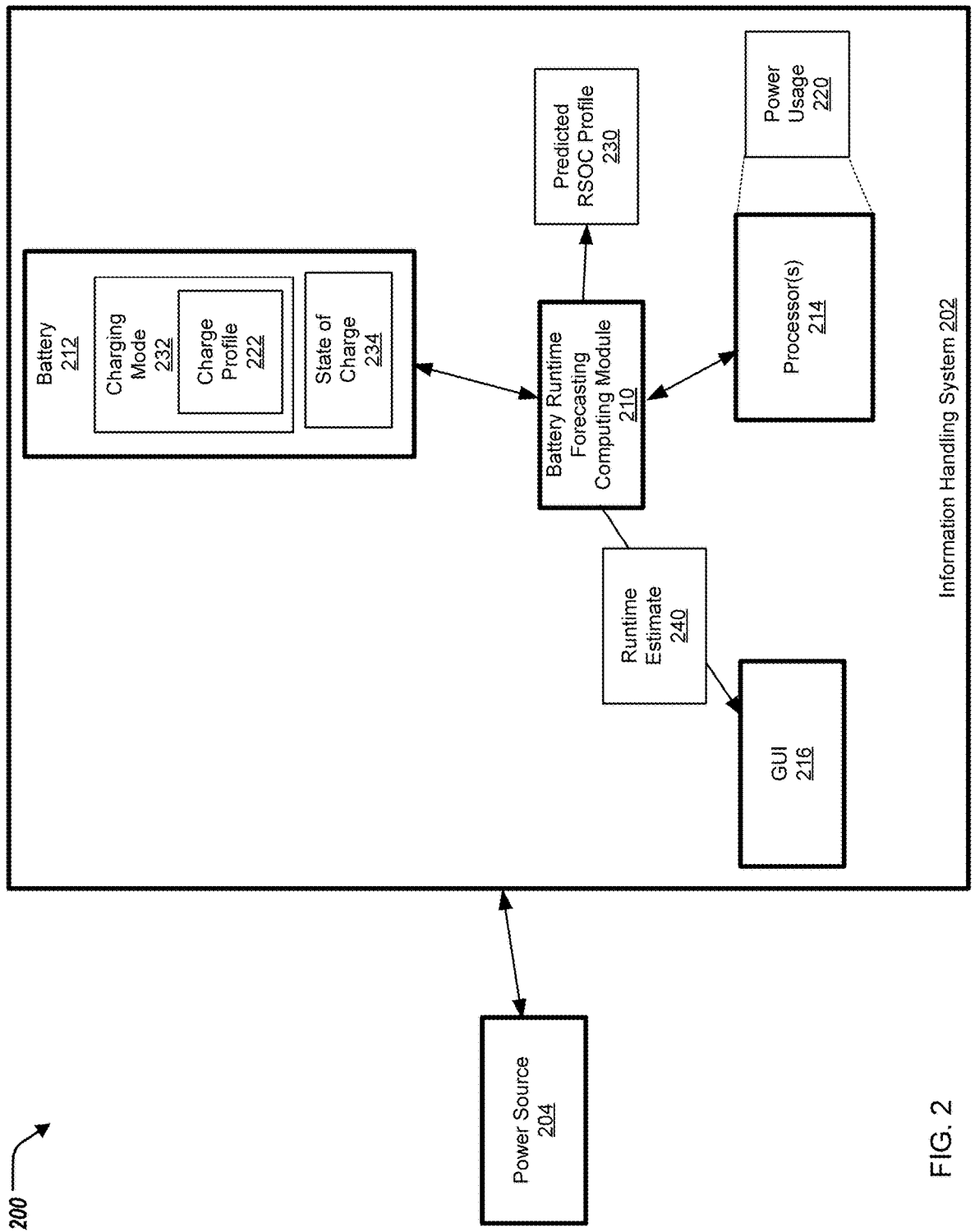
FIG. 2 illustrates a block diagram of a computing environment for battery runtime forecasting of the information handling system.

Turning now to FIG. 2, FIG. 2 illustrates a computing environment 200 that includes an information handling system (IHS) 202 and a power source 204. The power source 204 can be in communication with the IHS 202. The IHS 202 can be similar to the information handling system 100 of FIG. 1; and the power source 204 can be similar to the power source 192 of FIG. 1.

The IHS 202 further includes a battery runtime forecasting computing module 210, a battery 212, a processor (or processors) 214, and a graphical user interface (GUI) 216. The battery runtime forecasting computing module 210 can be similar to the runtime forecasting computing module 194 of FIG. 1; the battery 212 can be similar to the battery 190 of FIG. 1; and the processor 214 can be similar to the processor subsystem 120 of FIG. 1. The battery runtime forecasting computing module 210 can be in communication with the battery 212, the processor 214, and the GUI 216.

The power source 204 can supply power to the information handling system 202 for the operation of the information handling system 202 (e.g., by the processor 214).

Additionally, the power source 204 can provide power to the battery 212 for charging of the battery 212 (providing energy to the battery 212). In some cases, the power source 204 can concurrently provide power to the information handling system 202 for i) the operation of the information handling system 202 and ii) charging of the battery 212. In some examples, the power source 204 includes a charging adapter (or power adapter).

Figure 3:
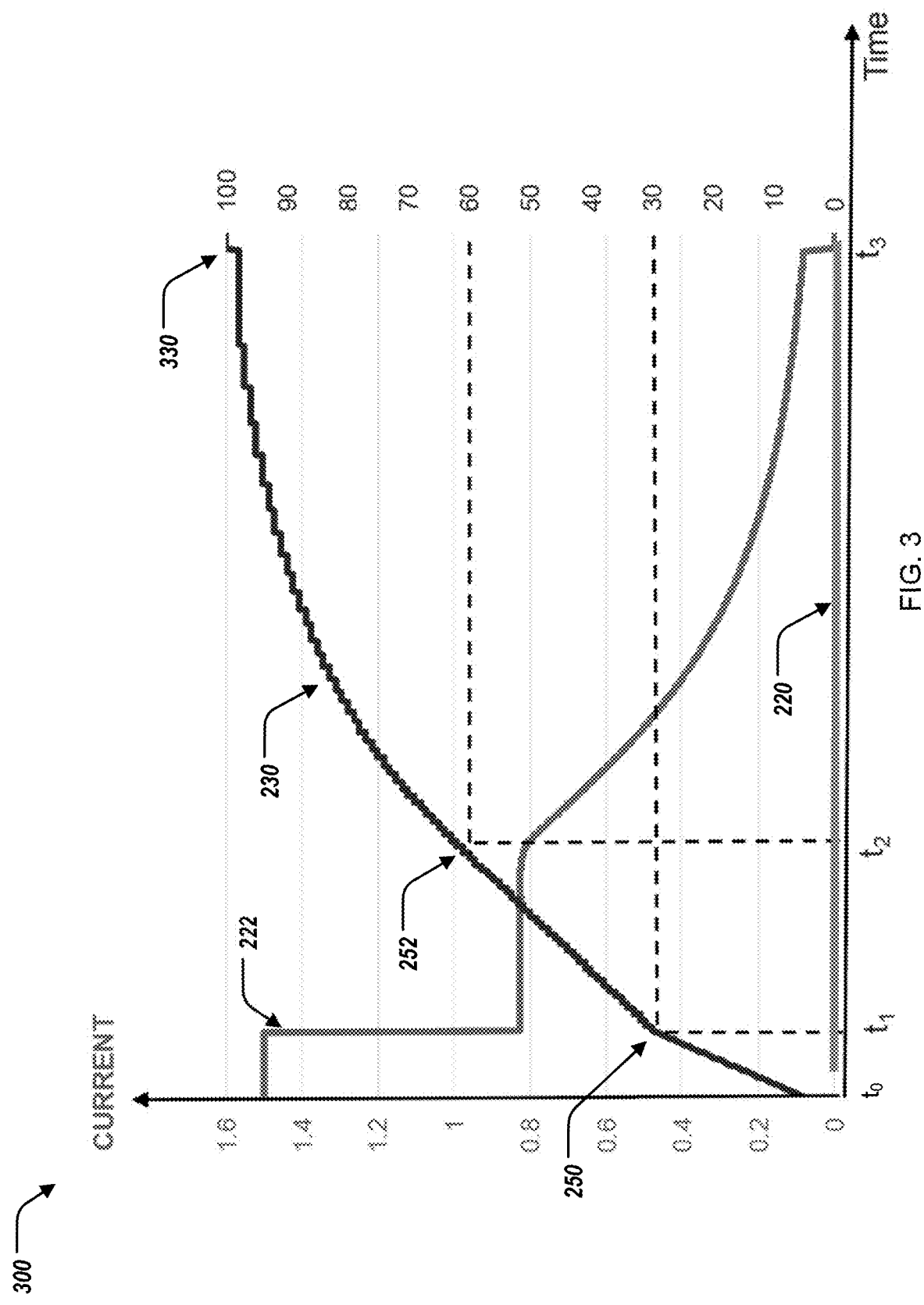
FIG. 3 illustrates a graph depicting a predicted (non-linear) relative state of charge of the battery, with no system activities by the information handling system.

FIG. 3 illustrates a graph 300 depicting a predicted (non-linear) RSOC 230 of the battery 212, as determined by the battery runtime forecasting computing module 210, discussed further herein. The y-axis of the graph 300 can indicate a current (ampere) (e.g., from 0-1.6 amperes), and the x-axis can indicate a time (e.g., from time $t_0$ to time $t_3$). Moreover, the graph 300 can depict the predicted RSOC 230 of the battery 212 from a minimal-charge (or 0% state of charge) of the battery 212 at time $t_0$ to a fully-charged (or 100% state of charge) of the battery 212 at time $t_3$. Specifically, FIG. 3 illustrates the predicted RSOC of the battery 212 when there is sufficient power delivery from the power source 204 (charging adapter) to supply requested charge current of the battery 212 throughout an entirety of the charging cycle of the battery 212.

Figure 4:
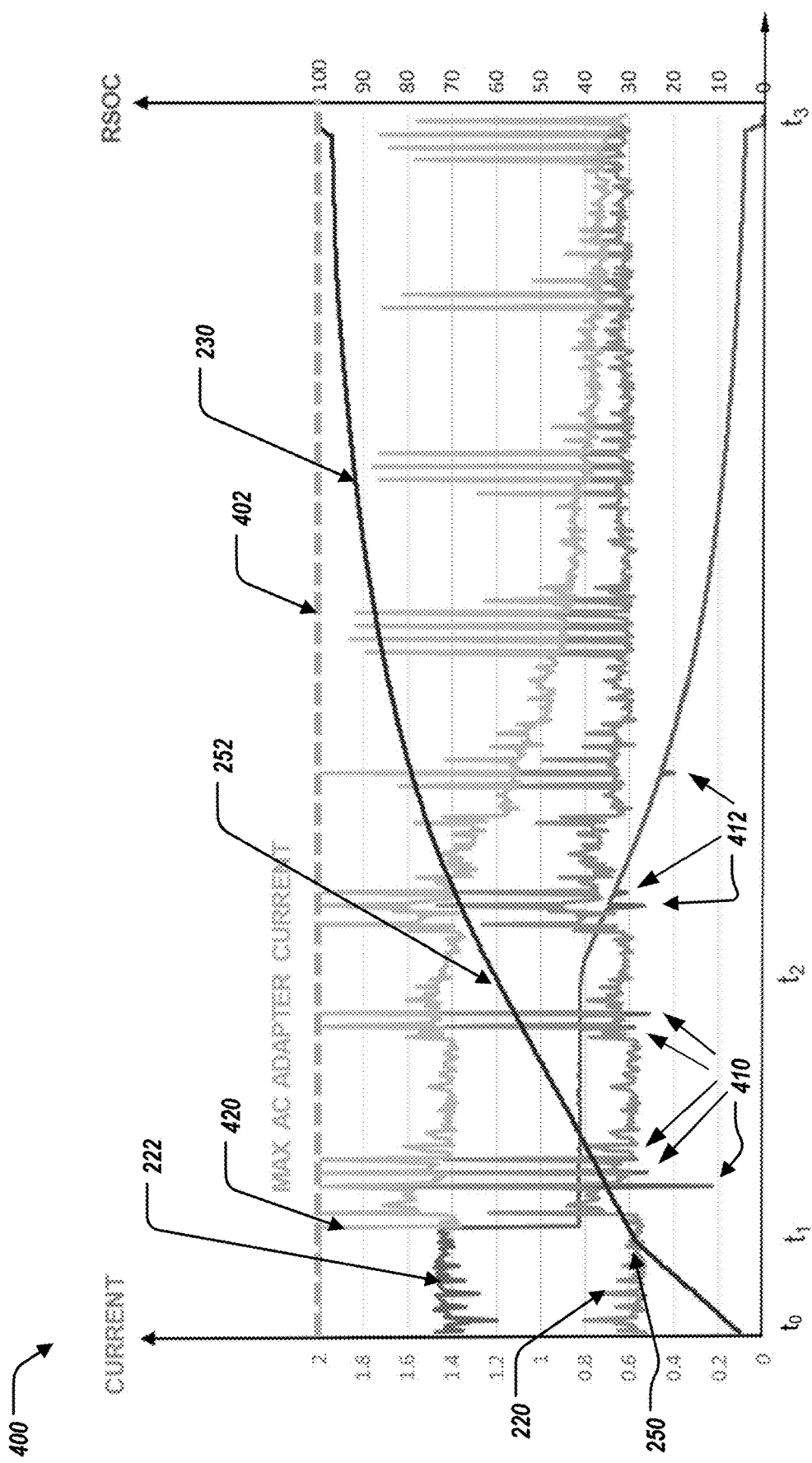
FIG. 4 illustrates a graph depicting a predicted (non-linear) relative state of charge of the battery, with system activities by the information handling system.

FIG. 4 illustrates a graph 400 depicting a predicted (non-linear) RSOC 230 of the battery 212, as determined by the battery runtime forecasting computing module 210, in a further implementation. The y-axis of the graph 400 can indicate a current (ampere) (e.g., from 0-1.6 amperes), and the x-axis can indicate a time (e.g., from time $t_0$ to time $t_3$). Moreover, the graph 400 can depict the predicted RSOC 230 of the battery 212 from a minimal-charge (or 0% state of charge) of the battery 212 at time $t_0$ to a fully-charged (or 100% state of charge) of the battery 212 at time $t_3$. Specifically, FIG. 4 illustrates the predicted RSOC of the battery 212 when the processor 214 is consuming power (i.e., system activities).

Furthermore, FIG. 4 illustrates a maximum adapter current 402 of the power source 204 (e.g., charging adapter). That is, the maximum adapter current 402 (or power delivery capabilities) is the maximum about amount of power (or current) that is able to be supplied by the power source 204 (e.g., power adapter). Thus, a total amount of power (or current) 420 consumed by the processor 214 (and the IHS 202) and the battery 212 cannot surpass the maximum adapter current 402. To that end, when the power consumed by the processor 214 (and power consumed by the IHS 202, and any components of the IHS 202 and any peripherals connected to the IHS 202, e.g., through a powershare port or USB port) and the battery 212 (total power 420) is greater than the maximum adapter current 402, the processor 214 takes priority over the battery 212. As a result, the power requested for charging the battery 212 is reduced such that power demands of the processor 214 are met, as discussed further herein.

Referring to FIGS. 2, 3, and 4, the battery runtime forecasting computing module 210 can identify a power usage 220 of the processor 214 of the IHS 202 (or current (ampere) usage 220 of the processor 214). In some examples, the battery runtime forecasting computing module 210 can request the power usage 220 from the processor 214; or the processor 214 can provide the power usage 220 to the battery runtime forecasting computing module 210 automatically (e.g., periodically—every 1 millisecond, 1 second, 1 minute, etc.). In some examples, the battery runtime forecasting computing module 210 can determine the power usage 220 directly (e.g. perform diagnostics) or indirectly.

For example, as shown in FIG. 3, the current (ampere) usage 220 is shown from time $t_0$ to time $t_3$ to be zero, or approximately zero. That is, the processor 214 is in a low-power state, or in a powered-off state. For example, as shown in FIG. 4, the power (or current) usage 220 of the IHS 202 can vary from time $t_0$ to time $t_3$; and can include multiple spikes of power (or current) usage. The power (ampere) usage 220 is shown from time $t_0$ to time $t_3$ to be between 0.6 amperes and approximately 0.85 amperes, with spikes of usage to 1.2 amperes and 1.4 amperes for short time durations. That is, the processor 214 is an operating state, or a powered-on state.

The battery runtime forecasting computing module 210 can identify a charge profile 222 of the battery 212 of the IHS 202. The charge profile 222 of the battery 212 can indicate charging rates of the battery 212 (i.e., requested charging rates) based on the state of charge of the battery 212. The charge profile 222 can include one or more charging levels each associated with a respective time period. In some examples, the charge profile 222 can be associated with other parameters for each respective time period, for example, voltage, or percent of charge of the battery 212.

In some examples, the battery runtime forecasting computing module 210 can receive the charge profile 222 from the battery 212, e.g., in response to a request or automatically (e.g., periodically—every 1 millisecond, 1 second, 1 minute, etc.). In some examples, the charge profile 222 of the battery 212 is stored in a lookup table (not shown) that the battery runtime forecasting computing module 210 can access. In some examples, the battery runtime forecasting computing module 210 can determine the charge profile 222 based on parameters of the battery 212. For example, the battery runtime forecasting computing module 210 can determine the charge profile 222 based on i) the charging level (e.g. amperes) provided to the battery 212 and ii) the requested charge (e.g., amperes) by the battery 212. When the charging level is the same as the requested charge over a time period (e.g., until the battery is fully charged—100% state of charge), the battery runtime forecasting computing module 210 can generate the charge profile 222 of the battery 212.

For example, as shown in FIG. 3, the charge profile 222 of the battery 212 is shown from time $t_0$ to time $t_3$. The charge profile 222 indicates charging levels (i.e., requested charging rates) of the battery 212 (from 0% state of charge to 100% state of charge) across 3 time periods. Specifically, for a first time period from time $t_0$ to time $t_1$, the charge profile 222 indicates a first (linear) charging level/rate (e.g., 1.5 amperes). The time to corresponds to a 0% RSOC, and the time $t_1$ corresponds to (depends on) a particular value 250 of the RSOC 230 (e.g., approximately 30% state of charge). That is, time $t_1$ is the time when the RSOC 230 is at value 250. In other words, between the values of RSOC of 0% to value 250 of the RSOC (e.g., 30% state of charge), the charge profile 222 indicates the first (linear) charging level/rate (e.g., 1.5 amperes). However, the particular value 250 can be any state of charge of the battery 212 based on the desired use of the battery 212.

For a second time period from time $t_1$ to time $t_2$, the charge profile 222 indicates a second (linear) charging level/rate (e.g., 0.85 volts). The time $t_2$ corresponds to (depends on) a particular value 252 of the RSOC 230 (e.g., approximately 60% state of charge). That is, time $t_2$ is the time when the RSOC 230 is at value 252. In other words, between the values 250 and 252 of the RSOC 230 (e.g., between 30% and 60% state of charge), the charge profile 222 indicates the second (linear) charging level/rate (e.g., 0.85 amperes). However, the particular value 252 can be any state of charge of the battery 212 based on desired use of the battery 212.

For a third time period from time $t_2$ to time $t_3$, the charge profile 222 indicates a third (sloped) charging level/rate (e.g., decreasing from 0.85 amperes to 0 amperes). The time $t_3$ corresponds to a 100% RSOC. In other words, between the value 252 of the RSOC 230 to 100% of the RSOC (e.g., between 60% and 100% state of charge), the charge profile 222 indicates the third (sloped) charging level/rate (e.g., decreasing from 0.85 amperes to 0 amperes). In some examples, for the third time period between the value 252 of the RSOC 230 and 100% of the RSOC, the third charging level/rate can be represented by the equation:

$$I(RSOC)=0.85\times(RSOC-X_{max})/(X_{252}-X_{max});$$

where RSOC is any value of the RSOC 230 between times $t_2$ and $t_3$, $X_{max}$ is the end of charge of the battery 212 (e.g., 100%), and $X_{252}$ is the RSOC at value 252.

To that end, when the requested charging rates of the battery 212 are satisfied (e.g., the battery 212 receives current equal to the requested charging rates), the time to full (TTF) of the battery 212 can be modeled as the equation:

$$TTF(RSOC)=(RSOC<X_{250})*(X_{250}-RSOC)/Z_1+ \\ (RSOC<X_{252})*(X_{252}-\max(X_{250},RSOC))/Z_2+ \\ (X_{max}-\max(X_{252},RSOC))*(X_{252}-X_{max})/(Z_2* \\ (RSOC-X_{max}));$$

where $X_{250}$ is the RSOC at value 250, $X_{252}$ is the RSOC at value 252, $X_{max}$ is the end of charge of the battery 212 (e.g., 100%), $Z_1$ is the first charging level/rate (e.g., 1.5 amperes), and $Z_2$ is the second charging level/rate (e.g., 0.85 amperes).

As shown in FIG. 4, the charge profile 222 of the battery 212 can indicate charging levels/rates of the battery 212 (i.e., requested charging rates) based on the state of charge of the battery 212 and the power usage 220 of the processor 214. That is, the summation of the charging rates/level of the battery 212 as indicated by the charge profile 222 and the power usage 220 cannot exceed the maximum adapter current 402.

As shown in FIG. 4, the charge profile 222 indicates charging levels/rates of the battery 212 (from 0% state of charge to 100% state of charge) across 3 time periods. Specifically, for a first time period from time $t_0$ to time $t_1$, the charge profile 222 indicates a first charging level/rate (e.g., between approximately 1.2 and 1.5 amperes). For a second time period from time $t_1$ to time $t_2$, the charge profile 222 indicates a second charging level/rate (e.g., approximately 0.85 amperes). However, at times 410 within the second time period, the charge profile 222 dips below the second charging level of approximately 0.85 amperes (e.g., below 0.85 amperes). This is result of a corresponding spike in the power usage 220 of the processor 214 at the same times 410, and that the summation of the charging rates/level of the battery 212 as indicated by the charge profile 222 and the power usage 220 (summation being the total power 420) cannot exceed the maximum adapter current 402. For a third time period from time $t_2$ to time $t_3$, the charge profile 222 indicates a third charging level/rate (e.g., decreasing from 0.85 volts to 0 volts). However, at times 412 within the third time period, the charge profile 222 dips below the third charging level. This is result of a corresponding spike in the power usage 220 of the processor 214 at the same times 412, and that the summation of the charging rates/level of the battery 212 as indicated by the charge profile 222 and the power usage 220 (summation being the total power 420) cannot exceed the maximum adapter current 402.

To that end, during each of the time periods, an average charge level of the charge profile 222 can be determined. That is, based on a requested charging level, each time period of the charge profile 222 can be associated with an average charge level that is a percentage of the requested charging level. For example, for the second time period between from time $t_1$ to time $t_2$, to account for the dips of the charge profile 222 at times 410, the battery runtime forecasting computing module 210 can determine that the provided charge is a certain first percentage of the requested charge level averaged over the second time period—e.g., 85%. Similarly, for the third time period from time $t_2$ to time $t_3$, to account for the dips of the charge profile 222 at times 412, the battery runtime forecasting computing module 210 can determine that the provided charge is a certain second percentage of the requested charge level averaged over the third time period—e.g., 90%. For the first time period from time $t_0$ to time $t_1$, as there are no dips of the charge profile, the percentage can be 100%.

To that end, when the requested charging rates of the battery 212 are not satisfied (e.g., the battery 212 does not receive current equal to the requested charging rates), the time to full (TTF) of the battery 212 can be modeled as the equation:

$$TTF(RSOC)=(RSOC<X_{250})*(X_{250}-RSOC)/Z_1+ \\ (RSOC<X_{252})*(X_{252}-\max(X_{250},RSOC))/ \\ (Z_2*P_1)+(X_{max}-\max(X_{252},RSOC))*(X_{252}-X_{max})/ \\ (Z_2*(RSOC-X_{max})*P_2);$$

where $X_{250}$ is the RSOC at value 250, $X_{252}$ is the RSOC at value 252, $X_{max}$ is the end of charge of the battery 212 (e.g., 100%), $Z_1$ is the first charging level/rate (e.g., 1.5 amperes), $Z_2$ is the second charging level/rate (e.g., 0.85 amperes), $P_1$ is the first percentage, and $P_2$ is the second percentage.

In some examples, the charge profile 222 of the battery 212 can be updated, or modified, based on usage of the battery 212 (e.g., over a period of time—1 day, 1 week, 1 month, 1 year). For example, the battery 212 can suffer from degradation (e.g., chemical energy retention degradation), and the charge profile 222 can be updated to reflect such degradation of the battery 212.

In some examples, the battery runtime forecasting computing module 210 can identify a charging mode 232 of the battery 212. The charging mode 232 can indicate a type of charge profile 222 to be employed when charging the battery 212. For example, the charging mode 232 can be a "standard" charge mode, a "fast/express" charge mode, and/or a "slow" charge mode. In some examples, the charging mode 232 can be set by a user of the IHS 202, or set automatically based on one or more parameters of the IHS 202 (e.g. processor load, etc.). The battery runtime forecasting computing module 210 can identify the charge profile 222 based on the charging mode 232 of the battery 212.

The battery runtime forecasting computing module 210 can determine a state of charge 234 of the battery 212 based on a current time. For example, the battery 212 can have a depleted state of charge (0%), a full charged state of charge (100%), or any state of charge between 0%-100%.

The battery runtime forecasting computing module 210 can generate the predicated RSOC profile 230 of the battery 212 based on i) the power usage 220 of the processor 214, ii) an entirety of the charge profile 222 of the battery 212, and iii) the state of charge 234 of the battery 212. Specifically, the battery runtime forecasting computing module 210 can generate, for each state of charge 234 of the battery 212 (e.g., from 0% state of charge to 100% state of charge), a predicated RSOC based on the power usage 220 of the IHS 202 as well as the charge profile 222 for the entirety of time (from time $t_0$ to time $t_3$). Thus, the battery runtime forecasting computing module 210 can generate the RSOC profile 230 with knowledge of the entirety of the charge profile 222 (from time $t_0$ to time $t_3$). That is, the battery runtime forecasting computing module 210 can generate the RSOC profile 230 that is consistent with the entirety of the charge profile 222, as opposed to generating the RSOC profile 230 based on instantaneous charge rates of the battery 212.

For example, at time $t_2$, the battery runtime forecasting computing module 210 generates the RSOC profile 230 (e.g., a time to 100% state of charge of the battery 212 as indicated by point 330) based on not just the charging level/rate of the battery 212 at the specific time $t_2$ that is indicated by the charge profile 222. Rather, at time $t_2$, the battery runtime forecasting computing module 210 generates the RSOC profile 230 based on the charging levels/rates of the entirety of the charge profile 222. Thus, at time $t_2$, the battery runtime forecasting computing module 210 generates the RSOC profile 230 at each of the times and states of charge based on the entirety of the charge profile 222 of the battery instead of the instantaneous charge rate/level of the battery 212 at time $t_2$.

In some examples, the battery runtime forecasting computing module 210 can generate the predicated RSOC profile 230 of the battery 212 based on i) the power usage 220 of the processor 214, ii) the charge profile 222 of the battery 212, iii) the state of charge 234 of the battery 212, and iv) the charging mode 232 of the battery 212. As mentioned previously, the charging mode 232 can indicate a type of charge profile 222 to be employed when charging the battery 212. Thus, based on the charging mode 232 utilized (or selected), the appropriate charge profile 222 of the battery 212 that corresponds to the charging mode 232 is utilized. To that end, the battery runtime forecasting computing module 210 can generate the predicated RSOC profile 230 based on i) the power usage 220 of the processor 214, ii) the charge profile 222 of the battery 212 that is associated with the charging mode 232, and iii) the state of charge 234 of the battery 212, and iv) the charge mode of the battery 212.

The battery runtime forecasting computing module 210 can identify a runtime estimate 240 of the battery 212 based on the predicted RSOC profile 230. Specifically, the battery runtime forecasting computing module 210 can identify, based on the RSOC profile 230, a time to fully charge the battery 212—e.g., from a 0% state of charge to 100% state of charge. In some examples, the battery runtime forecasting computing module 210 can identify the state of charge 234 of the battery 212 and a desired (or particular) state of charge of the battery 212. For example, the desired state of charge of the battery 212 can be a user-selected state of charge of the battery (e.g., 100% state of charge of the battery). The battery runtime forecasting computing module 210 can determine a particular time, based on the predicted RSOC profile 230, associated with the desired state of charge of the battery 212. For example, each state of charge of the battery 212 can be associated with a time based on the RSOC profile 230—e.g., a time from 0% state of charge of the battery 212 to the desired state of charge of the battery 212.

To that end, the battery runtime forecasting computing module 210 can identify a runtime estimate 240 of the battery 212 based on the predicted RSOC profile 230 and the current time. Specifically, the battery runtime forecasting computing module 210 can determining, for each time period, a time to full for the time period based on the predicted RSOC profile 230 of the battery 212 for the time period and the charging level of the time period; and calculate a summation of the time to full for each time period based on the current time to generate the runtime estimate of the battery 212. In other words, the battery runtime forecasting computing module 210 can determine the runtime estimate 240 based on the desired time (indicated the desired state of charge) and the current time (the state of charge 234). For example, the runtime estimate 240 can be the difference between the desired time and the current time. For example, when the state of charge 234 is associated with time $t_2$, and the desired state of charge is 100% state of charge, the battery runtime forecasting computing module 210 determines the runtime estimate 240 based on a difference between the times $t_3$ and $t_2$.

In some examples, the desired (or particular) state of charge is 100% state of charge of the battery 212. In some examples, the desired (or particular) state of charge is less than 100% state of charge of the battery 212.

In some examples, the battery runtime forecasting computing module 210 can provide the runtime estimate 240 to the GUI 216. The GUI 216 can display a notification indicating the runtime estimate 240.

Figure 5:
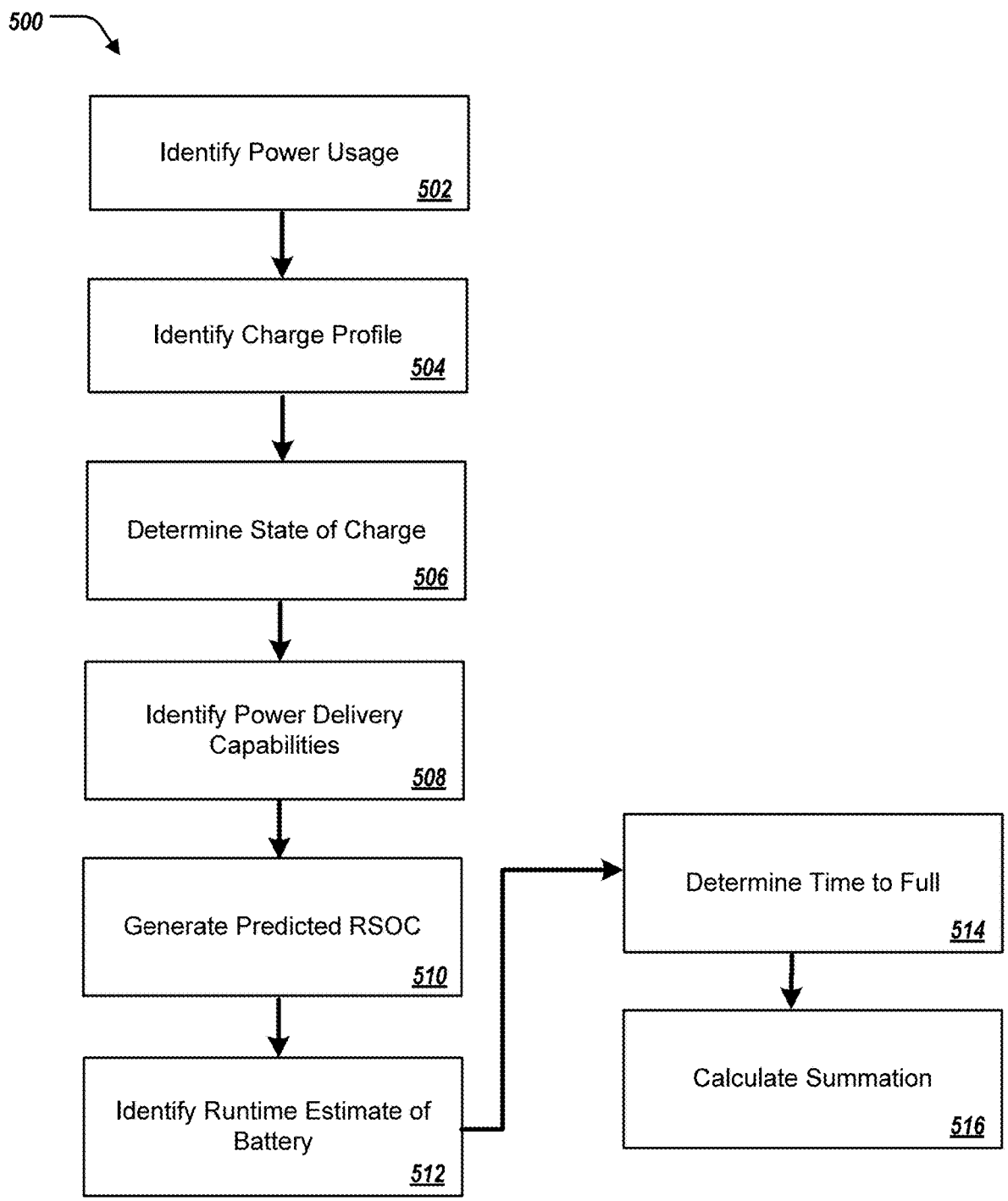
FIG. 5 illustrates a flowchart of a method for battery runtime forecasting of the information handling system.

FIG. 5 illustrates a flowchart depicting selected elements of an embodiment of a method 500 for runtime forecasting for an information handling system. The method 500 may be performed by the information handling system 100, the computing environment 200, the information handling system 202, and/or the battery runtime forecasting computing module 210, and with reference to FIGS. 1-4. It is noted that certain operations described in method 500 may be optional or may be rearranged in different embodiments.

The battery runtime forecasting computing module 210 identifies the power usage 220 of the processor 214 of the IHS 202 (502). The battery runtime forecasting computing module 210 identifies the charge profile 222 of the battery 212 of the IHS 202 (504). The battery runtime forecasting computing module 210 determines the state of charge 234 of the battery 212 (506). The battery runtime forecasting computing module 210 identifies power delivery capabilities of the power source 204 (508). The battery runtime forecasting computing module 210 generates the predicted RSOC 230 of the battery 212 based on i) the power usage 220, ii) the charge profile 222, and iii) the state of charge 234 (510). The battery runtime forecasting computing module 210 identifies the runtime estimate of the battery 212 based on the predicted RSOC 230 and the current time (512). Identifying the runtime estimate of the battery 212 further includes the battery runtime forecasting computing module 210 determining, for each time period, a time to full for the time period based on the predicted RSOC profile of the battery 212 for the time period and the charging level of the time period (514). Identifying the runtime estimate of the battery 212 further includes the battery runtime forecasting computing module 210 calculating a summation of the time to full for each time period based on the current time to generate the runtime estimate of the battery (516).

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both,"

unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computer-implemented method for battery runtime forecasting, comprising:
   identifying a power usage of an information handling system (IHS);
   identifying a charge profile of a battery of the IHS, the charge profile including one or more charging levels each associated with a respective time period;
   determining a state of charge of the battery based on a current time;
   identifying power delivery capabilities of a power source providing power to the battery;
   generating a predicted relative state of charge (RSOC) profile of the battery based on i) the power usage of the IHS, ii) an entirety of the charge profile of the battery, iii) the state of charge of the battery, and iv) power delivery capabilities of the power source;
   identifying a runtime estimate of the battery, including:
      i) determining, for each time period of a plurality of time periods, a time to full for the time period based on the predicted RSOC profile of the battery for the time period and the charging level of the time period, and
      ii) calculating a summation of the time to full for each time period of the plurality of time periods based on the current time to generate the runtime estimate of the battery; and
   charging the battery of the IHS based on the predicted RSOC profile of the battery and a power usage of a processor of the IHS.

2. The computer-implemented method of claim 1, further comprising:
   identifying a charging mode of the battery; and
   identifying the charge profile of the battery based on the charging mode of the battery.

3. The computer-implemented method of claim 2, further comprising:
   generating the predicted RSOC profile of the battery based on i) the power usage of the IHS, ii) the charge profile of the battery, iii) the state of charge of the battery, iv) the power delivery capabilities of the power source, and v) the charge mode of the battery.

4. The computer-implemented method of claim 1, further comprising: displaying, on a graphics user interface (GUI) of the IHS, a notification indicating the runtime estimate of the battery.

5. The computer-implemented method of claim 1, wherein identifying the runtime estimate of the battery further comprises:
   identifying a particular state of charge of the battery;
   determining, based on the predicted RSOC profile, a particular time associated with the particular state of charge; and
   determining the runtime estimate of the battery based on the particular time and the current time.

6. The computer-implemented method of claim 5, wherein the particular state of charge is 100% charge of the battery.

7. The computer-implemented method of claim 5, wherein the particular state of charge is less than 100% charge of the battery.

8. An information handling system, comprising:
   a battery;
   a memory storing instructions; and
   a processor in communication with the memory to perform operations comprising: identifying a power usage of the information handling system (IHS);
      identifying a charge profile of the battery of the IHS, the charge profile including one or more charging levels each associated with a respective time period;
      determining a state of charge of the battery based on a current time;
      identifying power delivery capabilities of a power source providing power to the battery;
      generating a predicted relative state of charge (RSOC) profile of the battery based on i) the power usage of the IHS, ii) an entirety of the charge profile of the battery, iii) the state of charge of the battery, and iv) power delivery capabilities of the power source;
      identifying a runtime estimate of the battery, including:
         i) determining, for each time period of a plurality of time periods, a time to full for the time period based on the predicted RSOC profile of the battery for the time period and the charging level of the time period, and
         ii) calculating a summation of the time to full for each time period of the plurality of time periods based on the current time to generate the runtime estimate of the battery; and
      charging the battery of the IHS based on the predicted RSOC profile of the battery and a power usage of a processor of the IHS.

9. The information handling system of claim 8, the operations further comprising:
   identifying a charging mode of the battery; and
   identifying the charge profile of the battery based on the charging mode of the battery.

10. The information handling system of claim 9, the operations further comprising:
    generating the predicted RSOC profile of the battery based on i) the power usage of the IHS, ii) the charge profile of the battery, iii) the state of charge of the battery, iv) the power delivery capabilities of the power source, and v) the charge mode of the battery.

11. The information handling system of claim 8, the operations further comprising:

displaying, on a graphics user interface (GUI) of the IHS, a notification indicating the runtime estimate of the battery.

12. The information handling system of claim 8, wherein identifying the runtime estimate of the battery further comprises:
   identifying a particular state of charge of the battery;
   determining, based on the predicted RSOC profile, a particular time associated with the particular state of charge; and
   determining the runtime estimate of the battery based on the particular time and the current time.

13. The information handling system of claim 12, wherein the particular state of charge is 100% charge of the battery.

14. The information handling system of claim 12, wherein the particular state of charge is less than 100% charge of the battery.

15. A non-transitory computer-readable medium comprising instructions executable by one or more computers which, upon such execution, cause the one or more computers to perform operations comprising:
   identifying a power usage of an information handling system (IHS);
   identifying a charge profile of a battery of the IHS, the charge profile including one or more charging levels each associated with a respective time period;
   determining a state of charge of the battery based on a current time;
   identifying power delivery capabilities of a power source providing power to the battery; generating a predicted relative state of charge (RSOC) profile of the battery based on i)
   the power usage of the IHS, ii) an entirety of the charge profile of the battery, iii) the state of charge of the battery, and iv) power delivery capabilities of the power source;
   identifying a runtime estimate of the battery, including:
      i) determining, for each time period of a plurality of time periods, a time to full for the time period based on the predicted RSOC profile of the battery for the time period and the charging level of the time period, and
      ii) calculating a summation of the time to full for each time period of the plurality of time periods based on the current time to generate the runtime estimate of the battery; and
   charging the battery of the IHS based on the predicted RSOC profile of the battery and a power usage of a processor of the IHS.

16. The computer-readable medium of claim 15, the operations further comprising:
   identifying a charging mode of the battery; and
   identifying the charge profile of the battery based on the charging mode of the battery.

17. The computer-readable medium of claim 16, the operations further comprising:
   generating the predicted RSOC profile of the battery based on i) the power usage of the IHS, ii) the charge profile of the battery, iii) the state of charge of the battery, iv) the power delivery capabilities of the power source, and v) the charge mode of the battery.

18. The computer-readable medium of claim 15, the operations further comprising:
   displaying, on a graphics user interface (GUI) of the IHS, a notification indicating the runtime estimate of the battery.

19. The computer-readable medium of claim 15, wherein identifying the runtime estimate of the battery further comprises:
   identifying a particular state of charge of the battery;
   determining, based on the predicted RSOC profile, a particular time associated with the particular state of charge; and
   determining the runtime estimate of the battery based on the particular time and the current time.

20. The computer-readable medium of claim 19, wherein the particular state of charge is 100% charge of the battery.

* * * * *